(12) United States Patent
Wang et al.

(10) Patent No.: US 10,965,139 B2
(45) Date of Patent: Mar. 30, 2021

(54) CHARGER CIRCUIT AND INTELLIGENT CHARGING CONTROL METHOD THEREOF

(71) Applicant: Shenzhen Lianxunfa Technology CO., LTD., Shenzhen (CN)

(72) Inventors: Shaopei Wang, Shenzhen (CN); Zezhi Li, Shenzhen (CN); Mingli Wu, Shenzhen (CN); Mingwei Wang, Shenzhen (CN)

(*) Notice: Subject to any disclaimer, the term of this patent is extended or adjusted under 35 U.S.C. 154(b) by 122 days.

(21) Appl. No.: 16/260,044

(22) Filed: Jan. 28, 2019

(65) Prior Publication Data

US 2020/0119574 A1    Apr. 16, 2020

(30) Foreign Application Priority Data

Oct. 16, 2018 (CN) .......................... 201811205368.6

(51) Int. Cl.

| H02J 7/00 | (2006.01) |
|---|---|
| G01R 31/36 | (2020.01) |
| G01R 31/3842 | (2019.01) |
| G01R 19/165 | (2006.01) |
| H02J 7/04 | (2006.01) |

(52) U.S. Cl.
CPC .. *H02J 7/007184* (2020.01); *G01R 19/16542* (2013.01); *G01R 31/3646* (2019.01); *G01R 31/3842* (2019.01); *H02J 7/0029* (2013.01); *H02J 7/045* (2013.01); *H02J 7/00302* (2020.01)

(58) Field of Classification Search
CPC ........................................................ H02J 7/00
USPC ........................................................ 320/136
See application file for complete search history.

(56) References Cited

U.S. PATENT DOCUMENTS

| 4,746,854 A * | 5/1988 | Baker | ................... | H02J 7/0071 |
| | | | | 320/130 |
| 2018/0248387 A1* | 8/2018 | Wang | ................... | H02J 7/0027 |

* cited by examiner

*Primary Examiner* — Robert Grant
(74) *Attorney, Agent, or Firm* — Prakash Nama; Global IP Services, PLLC

(57) ABSTRACT

A charger circuit and an intelligent charging control method thereof are disclosed. The charger circuit comprises a power circuit used to generate a charging voltage, a charging output switch, an MCU and an electrical appliance plug-in detection circuit, wherein the MCU is connected to a positive output terminal or a negative output terminal of the power circuit through a current sampling element to detect a charging current in a charging loop and is connected to a positive connecting terminal of a charging interface to detect a charging voltage in the charging loop. In this way, a charger is able to intelligently judge whether or not a to-be-charged electrical appliance is plugged into the charging interface, automatically charges the electrical appliance in a corresponding charging mode and effectively prevents overcharging of batteries of consumer electrical appliances, thus, prolonging the battery life and avoiding disasters caused by overcharging of the batteries.

7 Claims, 4 Drawing Sheets

CHARGER CIRCUIT AND INTELLIGENT CHARGING CONTROL METHOD THEREOF

BACKGROUND OF THE INVENTION

The invention relates to a charger circuit, in particular to a charger circuit suitable for consumer electrical appliances with batteries and an intelligent charging control method thereof.

At present, when traditional chargers, such as standard chargers provided by manufacturers of various consumer electrical appliances with batteries, are used for charging batteries, the batteries will be charged all the time after the chargers are powered on. Nowadays, USB interfaces are usually used to supply power to most electronic devices and have basically identical voltages. In actual life, chargers with USB interfaces are sometimes used as power sources of various electronic devices and are kept in the power-on state to supply power, which will result in the following drawbacks: the battery life may be shortened due to imperfect charging management, and batteries may be damaged or even catch fires due to overcharging, which will in turn result in fire disasters. In addition, batteries are consumable devices of which the performance and electrical parameters will change drastically in service over time, and for this reason, it is more necessary to prevent overcharging of the batteries in the charging process to avoid hazards and to prolong the battery life.

BRIEF SUMMARY OF THE INVENTION

To overcome the defects and drawbacks of the prior art, the invention provides a charger circuit and an intelligent charging control method thereof to prolong the service life of batteries of consumer electrical appliances by effectively avoiding overcharging of the batteries and to avoid disasters caused by overcharging of the batteries.

The invention is implemented based on the following technical solution: a charger circuit comprises a power circuit used to generate a charging voltage, a charging output switch, an MCU and an electrical appliance plug-in detection circuit.

A positive output terminal and a negative output terminal of the power circuit are respectively connected to a positive connecting terminal and a negative connecting terminal of a charging interface to form a charging loop.

The charging output switch has an input terminal and an output terminal both connected to the charging loop in series and a control terminal connected to the MCU.

The electrical appliance plug-in detection circuit has a signal input terminal connected to the negative connecting terminal of the charging interface and a signal output terminal connected to the MCU and is used to detect whether or not an electrical appliance is connected to the charging interface.

The MCU is connected to the positive output terminal or the negative output terminal of the power circuit through a current sampling element to detect a charging current in the charging loop and is connected to the positive connecting terminal of the charging interface to detect a charging voltage in the charging loop.

The charger circuit further comprises a key control and indication circuit connected with the MCU. The key control and indication circuit comprises a key circuit used for switching charging modes of a charger and an indicator lamp circuit used for indicating the charging modes.

Preferably, the electrical appliance plug-in detection circuit comprises a switching tube Q2, wherein a drain of the switching tube Q2 is connected to a voltage source VCC through a resistor R3, a gate of the switching tube Q2 is connected to the negative connecting terminal of the charging interface through a resistor R2, and a source of the switching tube Q2 is grounded.

Preferably, a switching element in the charging output switch is a MOSEFT, a power triode or a relay.

Preferably, the charging interface is a USB charging interface, the current sampling element is a resistor or a current transformer, and the power circuit generates a 5V, 9V or 12V charging voltage.

The invention further provides an intelligent charging control method of a charger circuit. The intelligent charging control method is applied to the charger circuit mentioned above and comprises the following steps:

Step S10, setting a default charging mode of the charger circuit as an intelligent charging mode after the MCU in the charger circuit is powered on and initialized;

Step S20, detecting whether or not a key K in the key control and indication circuit is pressed; if yes, setting the charging mode of the charger circuit as a normal charging mode; or if not, performing Step S30;

Step S30, detecting whether or not an electrical appliance is plugged into the charging interface by the electrical appliance plug-in detection circuit; if yes, controlling the switching element in the charging output switch to be turned on to charge a battery of the electrical appliance plugged into the charging interface in the intelligent charging mode; and Step S40, intelligently judging whether or not the battery is fully charged by detecting a charging current and a charging voltage in the charging loop through the MCU in the charging process; if not, continuing to charge the battery and detecting the charging current and the charging voltage; or if yes, controlling the switching element to be turned off, so that the charging loop is cut off to end charging, and thus, overcharging of the battery is prevented.

In Step S40, when the battery is charged, the whole charging process is divided into a pre-charging stage, a constant-current charging stage and a constant-voltage charging stage, and the charging current and the charging voltage are continuously detected in the charging process; and when it is detected that the charging current is small than a preset current value or the present charging current is greater than the preset current value and smaller than a current value for constant-current charging over a preset time, it is judged that the battery is fully charged.

Preferably, the preset current value is 50 mA, and the preset time is 60 min.

By adoption of the invention, a charger is able to intelligently judge whether or not a to-be-charged electrical appliance is plugged into the charging interface, automatically charges the electrical appliance in a corresponding charging mode and effectively prevents overcharging of batteries of consumer electrical appliances, thus, prolonging the battery life and avoiding disasters caused by overcharging of the batteries.

REFERENCE SIGNS

1—power circuit; 2—MCU; 3—charging interface; 4—electrical appliance plug-in detection circuit; 5—key control and indication circuit

DETAILED DESCRIPTION OF THE INVENTION

The invention is further expounded below with the accompanying drawings and specific embodiments so that those skilled in this field can have a better understanding of the invention.

Figure 1:
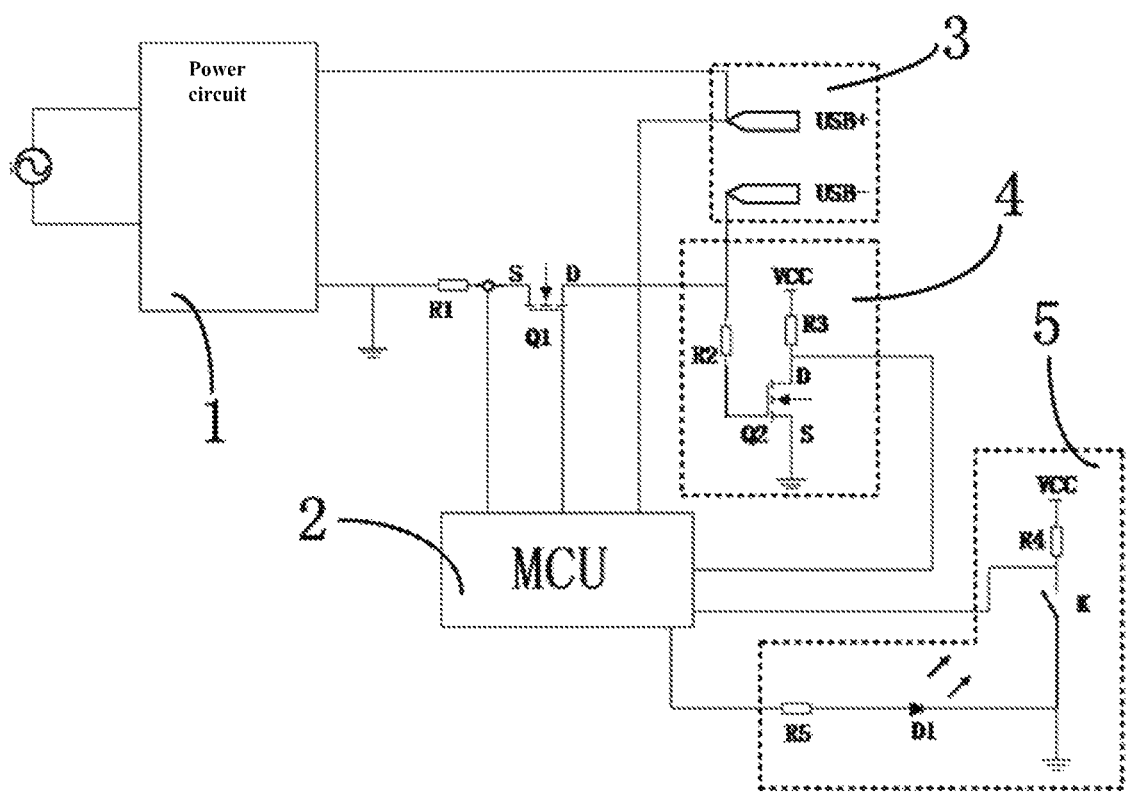
FIG. 1 is a circuit diagram of a charger circuit in the embodiment of the invention.

As shown in FIG. 1, the invention provides a charger circuit. The charger circuit comprises a power circuit 1 used to generate a charging voltage, a charging output switch, a MCU 2 and an electrical appliance plug-in detection circuit 4. A positive output terminal and a negative output terminal of the power circuit are respectively connected to a positive connecting terminal and a negative connecting terminal of a charging interface 3 to form a charging loop. The charging output switch has an input terminal and an output terminal both connected to the charging loop in series and a control terminal connected to the MCU. The electrical appliance plug-in detection circuit has a signal input terminal connected to the negative connecting terminal of the charging interface and signal output terminal connected to the MCU and is used to detect whether or not an electrical appliance is connected to the charging interface. The MCU is connected to the positive output terminal or the negative output terminal of the power circuit through a current sampling element to detect a charging current in the charging loop. The MCU is connected to the positive connecting terminal of the charging interface to detect a charging voltage in the charging loop. In this embodiment, the power circuit generates a 5V, 9V or 12V charging voltage, and the charging interface is preferably a USB charging interface.

In a preferred embodiment, a switching element Q1 in the charging output switch may be a MOSEFT (field effect transistor), a power triode or a relay. In addition, the current sampling element is a resistor or a current transformer. In this embodiment, the switching element Q1 is preferably a MOSEFT, wherein a gate of the MOSEFT is used as a control terminal to be connected with the MCU, and a drain and a source of the MOSEFT are used as an input terminal and an output terminal to be connected to the charging loop, as shown in FIG. 1. The current sampling element is preferably a high-precision resistor R1. As a voltage-type device, the MOSFET is easy to drive and has a simple drive circuit, a low loss and an extremely small on-voltage drop which will not affect the charging voltage to consumer electrical appliances with batteries. As shown in FIG. 1, the high-precision resistor R1 has an end connected to the negative output terminal of the power circuit and an end connected to the source of the switching element Q1. A drain of the switching element Q1 is connected to the negative connecting terminal of the charging interface. A gate of the switching element Q1 is connected to the MCU. In addition, the electrical appliance plug-in detection circuit comprises a switching tube Q2. A drain of the switching tube Q2 is connected to a voltage source VCC through a resistor R3. A gate of the switching tube Q2 is connected to the negative connecting terminal of the charging interface. A source of the switching tube Q2 is grounded.

In a preferred embodiment, the charger circuit further comprises a key control and indication circuit connected to the MCU. The key control and indication circuit comprises a key circuit used for switching charging modes of a charger and an indicator lamp circuit used for indicating the charging modes. In this embodiment, there are an intelligent charging mode and a normal charging mode. As shown in FIG. 1, the key circuit comprises a key K and a resistor R4, and the indicator lamp circuit comprises a resistor R5 and an indicator lamp D1. The specific circuit structure of the key circuit and the indicator lamp circuit is shown in FIG. 1 and is not described in detail anymore herein.

The operating principle or operating process of the charger circuit in this embodiment is correspondingly explained as follows: In this embodiment, sampling detection of the charging voltage and the charging current in the charging loop is implemented through AD sampling of the MCU, the MCU acquires voltage and current signals based on a principle in the prior art, and a detailed description of the principle will no longer be given herein. Definitely, acquisition and detection of the charging voltage and the charging current can also be implemented by an analog operation amplifier circuit, a comparator, a digital circuit or the like in the prior art.

In order to intelligently judge whether or not a to-be-charged electrical appliance is plugged into the charging interface of the charger, the electrical appliance plug-in detection circuit is used to fulfill the intelligent judgment function, and the corresponding operating principle is as follows: When an consumer electrical appliance with a battery is plugged into the charging interface (USB charging interface in this embodiment), the positive connecting terminal and the negative connecting terminal of the USB charging interface are connected by an internal circuit of the consumer electrical appliance with the battery or an internal circuit of an Apple data cable to form a loop, and at this moment, under a large resistance of the internal circuit of the consumer electrical appliance with the battery or the internal circuit of the Apple data cable, the consumer electrical appliance with the battery will not be charged; a signal will be generated by the loop formed at this moment to activate the switching tube Q2 in the electrical appliance plug-in detection circuit, and then plug-in of the consumer electrical appliance with the battery or the Apple data cable can be detected by detecting the level of the drain of the switching tube Q2 through the MCU. In this embodiment, the switching tube Q2 is a field effect transistor or a triode.

When it is judged that the consumer electrical appliance with the battery is plugged into the charging interface of the charger, the switching tube Q2 is turned off, the switching element Q1 is switched on, and the charger automatically enables the intelligent charging mode to charge the battery in the consumer electrical appliance. The key K can be controlled to switch the charger to the normal charging mode when necessary. Meanwhile, the indicator lamp D1 operates in different modes to indicate different charging modes. In the charging process, the MCU detects the charging current and the charging voltage in the charging loop. When detecting that the battery is fully charged or a short circuit occurs, the MCU outputs a corresponding signal to turn off the switching element Q1 so as to cut off the charging loop, and thus, overcharging of the battery is effectively prevented.

In this embodiment, the intelligent charging mode is a default charging mode. In the intelligent charging mode, whether or not the battery is fully charged is judged by detecting the charging current, particularly, when it is detected that the charging current is smaller than a preset current value (such as 50 mA), the MCU sends out a corresponding control signal to turn off the switching element Q1, then the charging loop is cut off to stop charging the battery, and thus, overcharging of the battery is effectively avoided. Detection of the charging current belongs to the prior art, and the invention does not involve any improvements on computer programs. The normal charging mode refers to a common charging mode in the prior art and cannot fulfill the function of preventing overcharging of batteries.

Figure 2:
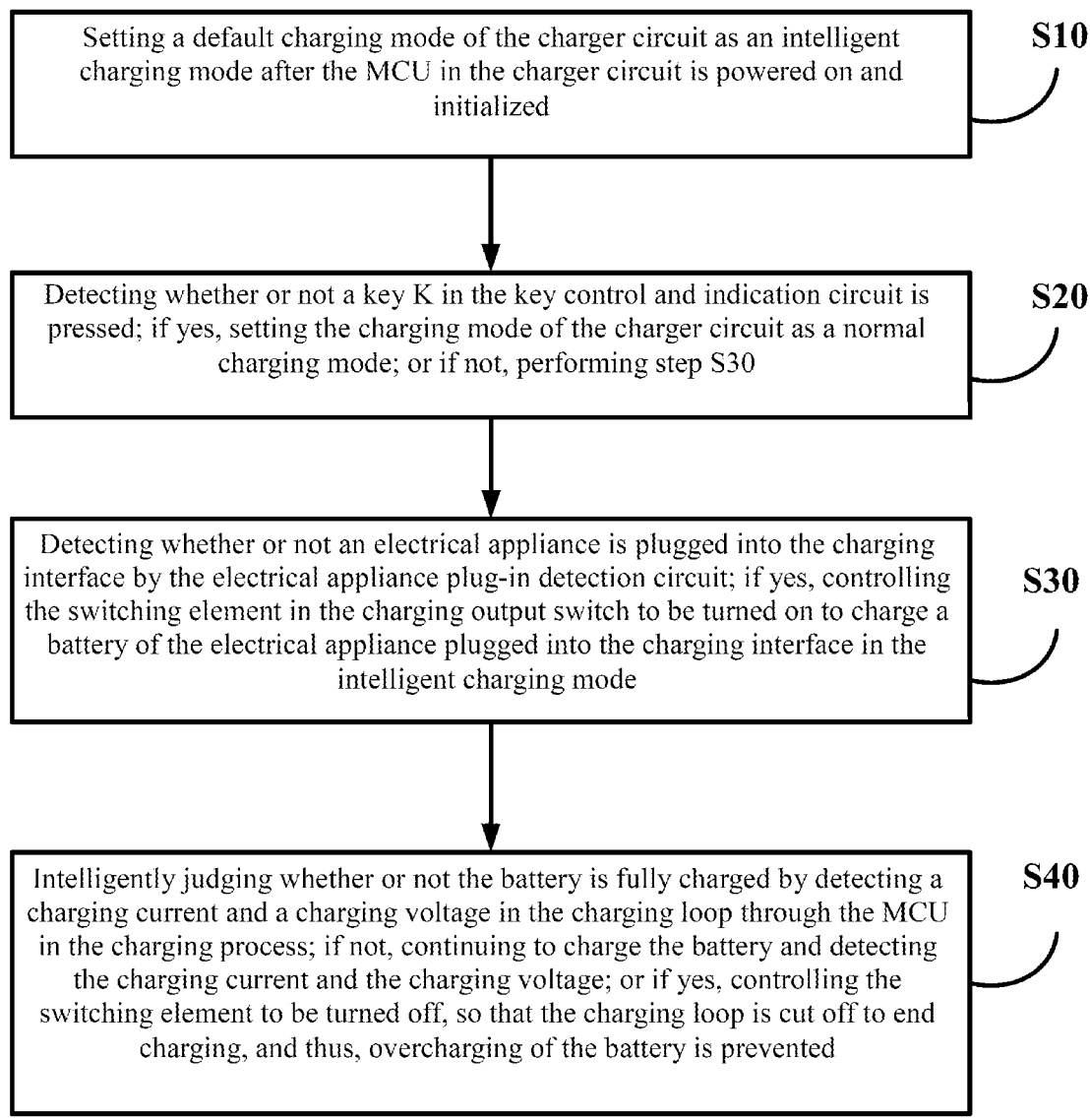
FIG. 2 is a flow diagram of a method in the embodiment of the invention.

The embodiment of the invention further provides an intelligent charging control method based on the charger circuit. As shown in FIG. 2, the intelligent charging control method comprises the following steps:

Step S10, after the MCU in the charger circuit is powered on and initialized, the default charging mode of the charger circuit is set as the intelligent charging mode;

Step S20, whether or not the key K in the key control and indication circuit is pressed is detected; if yes, the charging mode of the charger circuit is set as the normal charging mode; or if not, Step S30 is performed;

Step S30, whether or not an electrical appliance is plugged into the charging interface is detected by the electrical appliance plug-in detection circuit; if yes, the switching element in the charging output switch is controlled to be turned on to charge a battery in the electrical appliance plugged into the charging interface in the intelligent charging mode;

Step S40, in the charging process, whether or not the battery is fully charged is intelligently judged by detecting the charging current and the charging voltage in the charging loop through the MCU; if not, the battery continues to be charged, and the charging current and the charging voltage are detected; or if yes, the switching element is controlled to be turned off, so that the charging loop is cut off to end charging, and thus, overcharging of the battery is prevented.

In Step S40, when the battery is charged, the whole charging process is divided into a pre-charging stage, a constant-current charging stage and a constant-voltage charging stage, and the charging current and the charging voltage are continuously detected in the charging process. When it is detected that the charging current is small than a preset current value (suitable for charging detection and judgment of a single group of batteries) or the present charging current is greater than the preset current value and smaller than a current value for constant-current charging over a preset time (suitable for charging detection and judgment of a plurality of groups of batteries connected in series or parallel), it is judged that the battery is completely charged. In this embodiment, the preset current value is preferably 50 mA, and the preset time is preferably 60 min. Of course, the preset current value and the preset time can be set according to actual requirements, for instance, the preset current value may be 30 mA, and the preset time may be 90 min.

Figure 3:
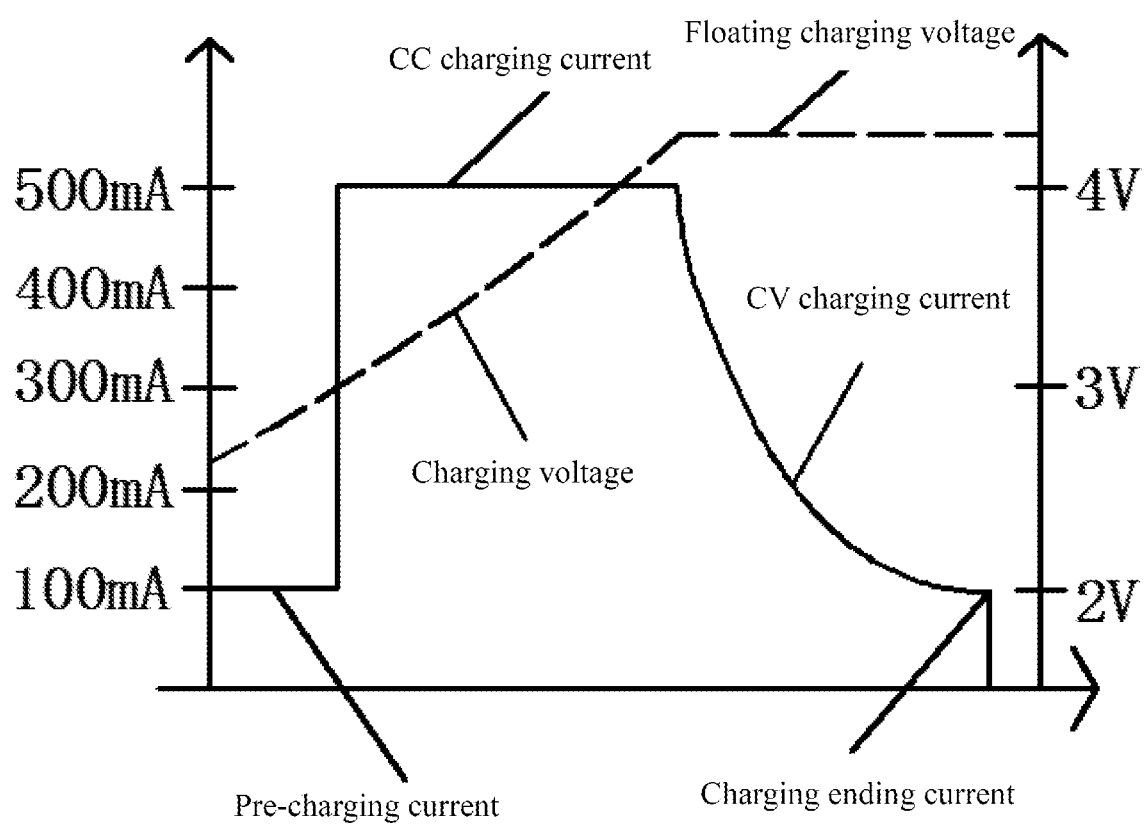
FIG. 3 is a battery charging characteristic curve chart in the embodiment of the invention.

In this embodiment, the battery charging process is divided into three charging stages. Referring to the charging characteristic curve chart in FIG. 3, a pre-charging current area, a CC charging current area and a CV charging current area in FIG. 3 respectively correspond to a pre-charging stage, a constant-current charging stage and a constant-voltage charging stage. In the invention, the MCU continuously detects the charging current and the charging voltage in the charging loop to determine the specific battery charging stage, and whether or not the battery is fully charged is judged by detecting the charging current in the constant-voltage charging stage.

Figure 4:
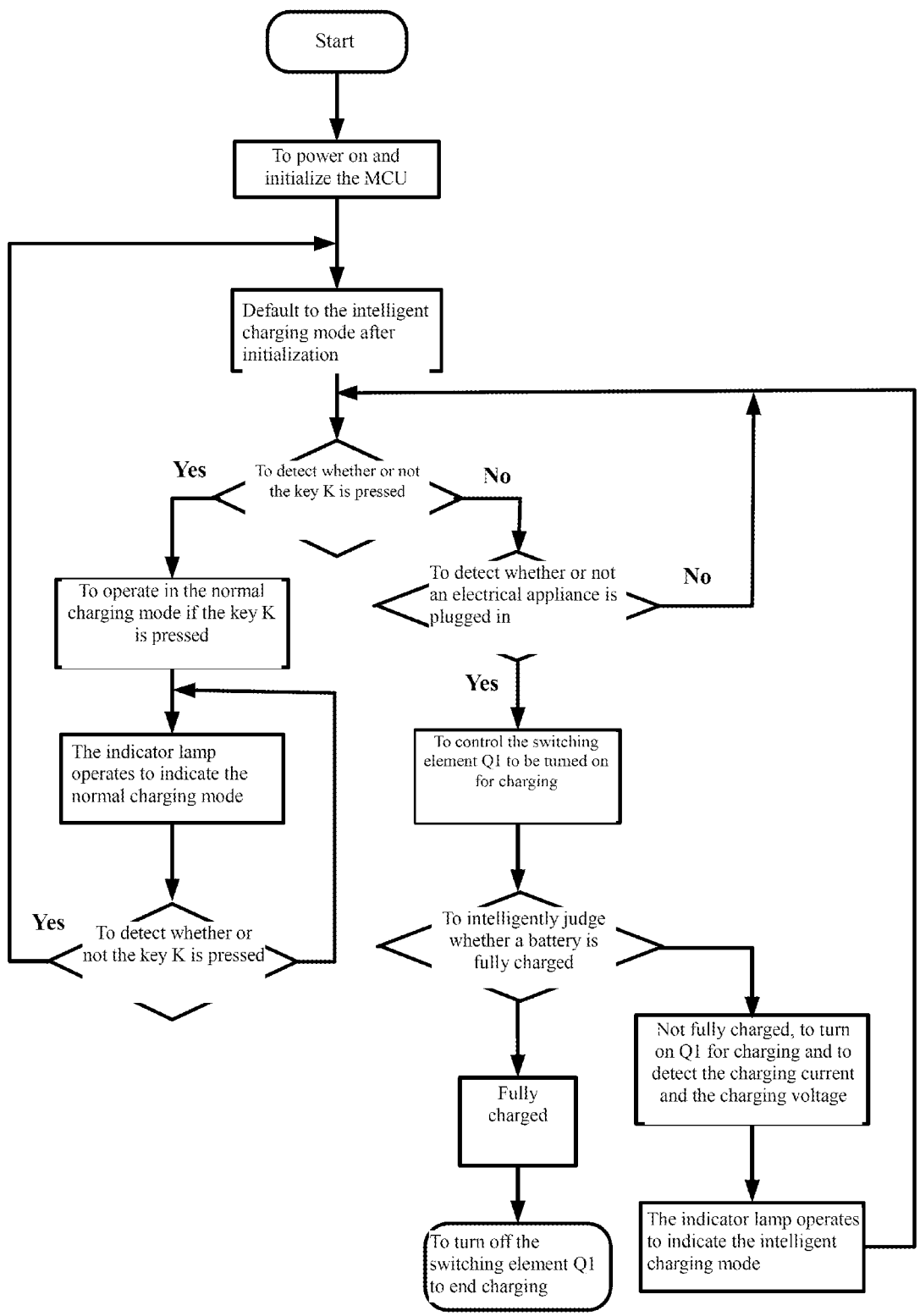
FIG. 4 is a preferred specific flow diagram of the method in the embodiment of the invention.

A preferred specific flow diagram of the method of the invention is shown in FIG. 4. In this embodiment, the key control and indication circuit continuously detects whether or not the key K is pressed in the charging process; if yes, the charging mode is switched. At the same time, the indicator lamp D1 in the key control and indication circuit operates in a corresponding state to indicate the current charging mode.

By adoption of the charger circuit of the invention, the charger is able to intelligently judge whether or not a to-be-charged electrical appliance is plugged into the charging interface, automatically charges the electrical appliance in a corresponding mode and effectively prevents overcharging of batteries of consumer electrical appliances, thus, prolonging the battery life and avoiding disasters caused by overcharging of the batteries.

The above embodiments are preferred implementations of the invention, but are not intended to limit the invention. Any substitutes easily achieved without deviating from the concept of the invention should also fall within the protection scope of the invention.

What is claimed is:

1. A charger circuit, comprising a power circuit used to generate a charging voltage, a charging output switch, a micro control unit (MCU) and an electrical appliance plug-in detection circuit, wherein:
    a positive output terminal and a negative output terminal of the power circuit are respectively connected to a positive connecting terminal and a negative connecting terminal of a charging interface to form a charging loop;
    the charging output switch has an input terminal and an output terminal both connected into the charging loop in series and a control terminal connected to the MCU;
    the electrical appliance plug-in detection circuit has a signal input terminal connected to the negative connecting terminal of the charging interface and a signal output terminal connected to the MCU and is used to detect whether or not an electrical appliance is connected to the charging interface;
    the MCU is connected to the positive output terminal or the negative output terminal of the power circuit through a current sampling element to detect a charging current in the charging loop and is connected to the positive connecting terminal of the charging interface to detect a charging voltage in the charging loop;
    the charger circuit further comprises a key control and indication circuit connected to the MCU, and the key control and indication circuit comprises a key circuit used for switching charging modes of a charger and an indicator lamp circuit used for indicating the charging modes;
    the electrical appliance plug-in detection circuit comprises a switching tube Q2, a drain of the switching tube Q2 is connected to a voltage source VCC through a resistor R3, a gate of the switching tube Q2 is connected to the negative connecting terminal of the charging interface through a resistor R2, and a source of the switching tube Q2 is grounded.

2. The charger circuit according to claim 1, wherein a switching element in the charging output switch is a MOSEFT, a power triode or a relay.

3. The charger circuit according to claim 2, wherein the charging interface is a USB charging interface.

4. The charger circuit according to claim 3, wherein the current sampling element is a resistor or a current transformer.

5. The charger circuit according to claim 4, wherein the power circuit generates a 5V, 9V or 12V charging voltage.

6. An intelligent charging control method of a charger circuit, applied to the charger circuit according to claim 5 and comprising the following steps:
- step S10, setting a default charging mode of the charger circuit as an intelligent charging mode after the MCU in the charger circuit is powered on and initialized;
- step S20, detecting whether or not a key K in the key control and indication circuit is pressed; if yes, setting the charging mode of the charger circuit as a normal charging mode; or if not, performing Step S30;
- step S30, detecting whether or not an electrical appliance is plugged into the charging interface by the electrical appliance plug-in detection circuit; if yes, controlling the switching element in the charging output switch to be turned on to charge a battery of the electrical appliance plugged into the charging interface in the intelligent charging mode; and
- step S40, intelligently judging whether or not the battery is fully charged by detecting a charging current and a charging voltage in the charging loop through the MCU in the charging process; if not, continuing to charge the battery and detecting the charging current and the charging voltage; or if yes, controlling the switching element to be turned off, so that the charging loop is cut off to end charging, and thus, overcharging of the battery is prevented, wherein:
- in Step S40, when the battery is charged, the whole charging process is divided into a pre-charging stage, a constant-current charging stage and a constant-voltage charging stage, and the charging current and the charging voltage are continuously detected in the charging process; and when it is detected that the charging current is smaller than a preset current value or a present charging current is greater than the preset current and smaller than a current value for constant-current charging over a preset time, it is judged that the battery is fully charged.

7. The method according to claim 6, wherein the preset current value is 50 mA, and the preset time is 60 min.

* * * * *